(12) United States Patent
Pabst et al.

(10) Patent No.: US 9,362,234 B2
(45) Date of Patent: Jun. 7, 2016

(54) SHIELDED DEVICE PACKAGES HAVING ANTENNAS AND RELATED FABRICATION METHODS

(71) Applicants: Eduard J. Pabst, Mesa, AZ (US);
Sergio P. Pacheco, Scottsdale, AZ (US);
Weng F. Yap, Chandler, AZ (US)

(72) Inventors: Eduard J. Pabst, Mesa, AZ (US);
Sergio P. Pacheco, Scottsdale, AZ (US);
Weng F. Yap, Chandler, AZ (US)

(73) Assignee: FREESCALE SEMICONDUCTOR, INC., Austin, TX (US)

( * ) Notice: Subject to any disclaimer, the term of this patent is extended or adjusted under 35 U.S.C. 154(b) by 361 days.

(21) Appl. No.: 14/149,335

(22) Filed: Jan. 7, 2014

(65) Prior Publication Data

US 2015/0194388 A1    Jul. 9, 2015

(51) Int. Cl.
*H01L 23/552* (2006.01)
*H01L 21/00* (2006.01)
*H01L 21/768* (2006.01)
*H01L 23/31* (2006.01)
*H01L 23/00* (2006.01)
*H01L 23/66* (2006.01)
*H01L 23/498* (2006.01)
*H01L 23/538* (2006.01)
*H01L 21/56* (2006.01)

(52) U.S. Cl.
CPC ............ *H01L 23/552* (2013.01); *H01L 21/768* (2013.01); *H01L 23/3128* (2013.01); *H01L 24/19* (2013.01); *H01L 21/568* (2013.01); *H01L 23/49816* (2013.01); *H01L 23/5389* (2013.01); *H01L 23/66* (2013.01); *H01L 2223/6677* (2013.01); *H01L 2224/12105* (2013.01)

(58) Field of Classification Search
CPC .............................. H01L 23/552; H01L 21/00
See application file for complete search history.

(56) References Cited

U.S. PATENT DOCUMENTS

| | | |
|---|---|---|
| 5,557,142 A | 9/1996 | Gilmore et al. |
| 7,030,469 B2 | 4/2006 | Mahadevan et al. |
| 7,651,889 B2 | 1/2010 | Tang et al. |
| 7,838,420 B2 | 11/2010 | Tang et al. |
| 7,981,730 B2 | 7/2011 | Tang et al. |
| 8,097,494 B2 | 1/2012 | Tang et al. |
| 8,187,920 B2 | 5/2012 | Mohan et al. |
| 2010/0044840 A1 | 2/2010 | Tang et al. |
| 2010/0193935 A1 | 8/2010 | Lachner et al. |

*Primary Examiner* — Marvin Payen (57) ABSTRACT

Shielded device packages and related fabrication methods are provided. An exemplary device package includes one or more electrical components, a molding compound overlying the one or more electrical components, a conductive interconnect structure within the molding compound, a conductive frame structure laterally surrounding the one or more electrical components and the interconnect structure, and a shielding structure overlying the one or more electrical components. The shielding structure is electrically connected to the frame structure and at least a portion of the molding compound resides between the shielding structure and the one or more electrical components.

19 Claims, 8 Drawing Sheets

SHIELDED DEVICE PACKAGES HAVING ANTENNAS AND RELATED FABRICATION METHODS

TECHNICAL FIELD

Embodiments of the subject matter described herein relate generally to electronic device packaging, and more particularly, to device packages with shielding from electromagnetic interference and related fabrication methods.

BACKGROUND

Semiconductor devices are continually designed to be smaller, more complex and/or packaged more densely to thereby facilitate modern electronic devices that continually decrease in size and/or increase in complexity. For electronic devices that include multiple integrated circuits or multi-chip modules packaged within a relatively small area, minimizing electromagnetic interference (EMI) from external sources remains a concern. Many existing solutions for providing EMI shielding for device packages often undesirably increase size and/or costs or otherwise involve additional processing steps. For example, a cover may be provided over a semiconductor device package, which, in turn, increases the area footprint of the printed circuit board (PCB) or electronics substrate that the cover is mounted to and also requires additional fabrication steps be performed to align the cover with the semiconductor device package and affix the cover to the PCB or electronics substrate. Other approaches for integrating EMI shielding into multi-chip modules often require complex fabrication process steps that are difficult to implement and/or result in device packages that may be susceptible mechanical failures (e.g., delamination or the like).

In some applications, it may be desirable for electronic devices to access one or more antennas for transmitting and/or receiving electromagnetic signals. However, EMI shielding can impair the ability of antennas to transmit and/or receive electromagnetic signals. Thus, the antennas must be arranged in a manner that prevents the EMI shielding from influencing their ability to operate, which may offset other packaging gains with respect to the size and/or area of the electronic devices and/or increase the complexity of assembly.

BRIEF DESCRIPTION OF THE DRAWINGS

The various embodiments will hereinafter be described in conjunction with the following drawing figures, which are not necessarily drawn to scale, wherein like numerals denote like elements, and wherein:

FIG. 2 depicts a perspective view of the device package of FIG. 1 in accordance with one or more embodiments of the invention, where FIG. 1 depicts a cross-sectional view when viewed along the line 1-1 in FIG. 2;

FIG. 17 depicts a perspective view of the device package of FIG. 16 in accordance with one or more embodiments of the invention, where FIG. 16 depicts a cross-sectional view when viewed along the line 16-16 in FIG. 17.

DETAILED DESCRIPTION

The following detailed description is merely illustrative in nature and is not intended to limit the embodiments of the subject matter or the application and uses of such embodiments. Any implementation described herein as exemplary is not necessarily to be construed as preferred or advantageous over other implementations. Additionally, there is no intention to be bound by any expressed or implied theory presented in the preceding technical field, background, or the following detailed description.

Embodiments of the subject matter described herein relate to device packages that incorporate shielding from electromagnetic interference (EMI). As described in greater detail below, one or more electrical components contained within a device package are circumscribed or otherwise laterally surrounded by a frame structure that is electrically connected to an overlying shielding structure that is bonded, joined, or otherwise coupled to the frame structure and spans the electrical component(s). The frame structure provides lateral shielding from EMI while the shielding structure provides shielding from EMI in the direction orthogonal to the plane defined by the frame structure. In exemplary embodiments, the frame structure is embedded within a molding compound that overlies and surrounds or otherwise encapsulates the electrical components. In this regard, interior portions of the molding compound reside laterally between the frame structure and the electrical component(s) and also between the shielding structure and the electrical component(s), while peripheral portions of the molding compound laterally circumscribe, surround, or otherwise encapsulate the frame structure.

Additionally, an antenna structure is provided on the device package overlying the shielding structure. In this regard, the antenna structure may also overlie the electrical component(s), but the portions of the shielding structure that reside between the antenna structure and the electrical component(s) shield the electrical component(s) from the electromagnetic signals transmitted and/or received by the antenna structure. It should be noted that while the subject matter may be described herein in the context of an antenna being provided on the device package and overlying the shielding structure and/or the electrical component(s) for purposes of explanation, in practice, any type and/or number of electrical component(s) may be provided on the device package and overlying the shielding structure and/or the electrical component(s) in addition to and/or in lieu of the antenna structure. That said, for purposes of explanation but without limitation, the subject matter is described herein in the context of an antenna structure on the device package.

To provide an electrical connection to the antenna structure, a conductive interconnect structure (alternatively referred to herein as a through-via) is formed within the molding compound and electrically connected to the antenna structure. In this manner, the through-via provides a path through the molding compound for electrical signals corresponding to the electromagnetic signals transmitted and/or received from the antenna structure. In exemplary embodiments, the through-via is also circumscribed by the frame structure, such that portions of the molding compound reside between the frame structure and the through-via. Furthermore, in some embodiments, an intermediate portion of the frame structure may reside laterally between the through-via and the electrical component(s), thereby laterally shielding the electrical component(s) from any potential EMI that may be emitted by the through-via transmitting electrical signals corresponding to the electromagnetic signals transmitted and/or received by the antenna structure. When the shielding structure spans the through-via, an opening aligned with the through-via is provided within the shielding structure to electrically isolate the through-via from the shielding structure. In other words, the opening prevents undesired electrical connections between the shielding structure and the through-via and provides a path through the shielding structure to the overlying antenna structure. In this regard, in some embodiments, no portions of the shielding structure directly overlies the through-via.

In one or more embodiments, the shielded device package includes one or more semiconductor dies (or chips) that overlie a routing structure comprised of one or more redistribution metallization layers that provide vertical and/or lateral interconnections to/from the input and/or output interfaces (I/Os) of the semiconductor die(s) and connection structures (e.g., solder balls or the like) used to interface with the device package. In exemplary embodiments, the redistribution metallization layers are configured to provide an electrical connection between the frame structure and a ground reference voltage for the semiconductor die(s), so that the frame structure and the shielding structure conduct currents induced by EMI to ground. Additionally, the redistribution metallization layers are configured to provide an electrical connection between the through-via and an I/O(s) of the semiconductor die(s) and/or the device package. In this manner, electrical signals corresponding to the electromagnetic signals transmitted and/or received by the antenna structure are transmitted to/from the semiconductor die(s) and/or the package I/O(s) through the through-via and the routing structure. By virtue of the frame structure being embedded within the molding compound, electrically grounded, and substantially planar in shape, the frame structure may alternatively be referred to herein as an embedded ground plane (EGP) frame.

Figure 1:
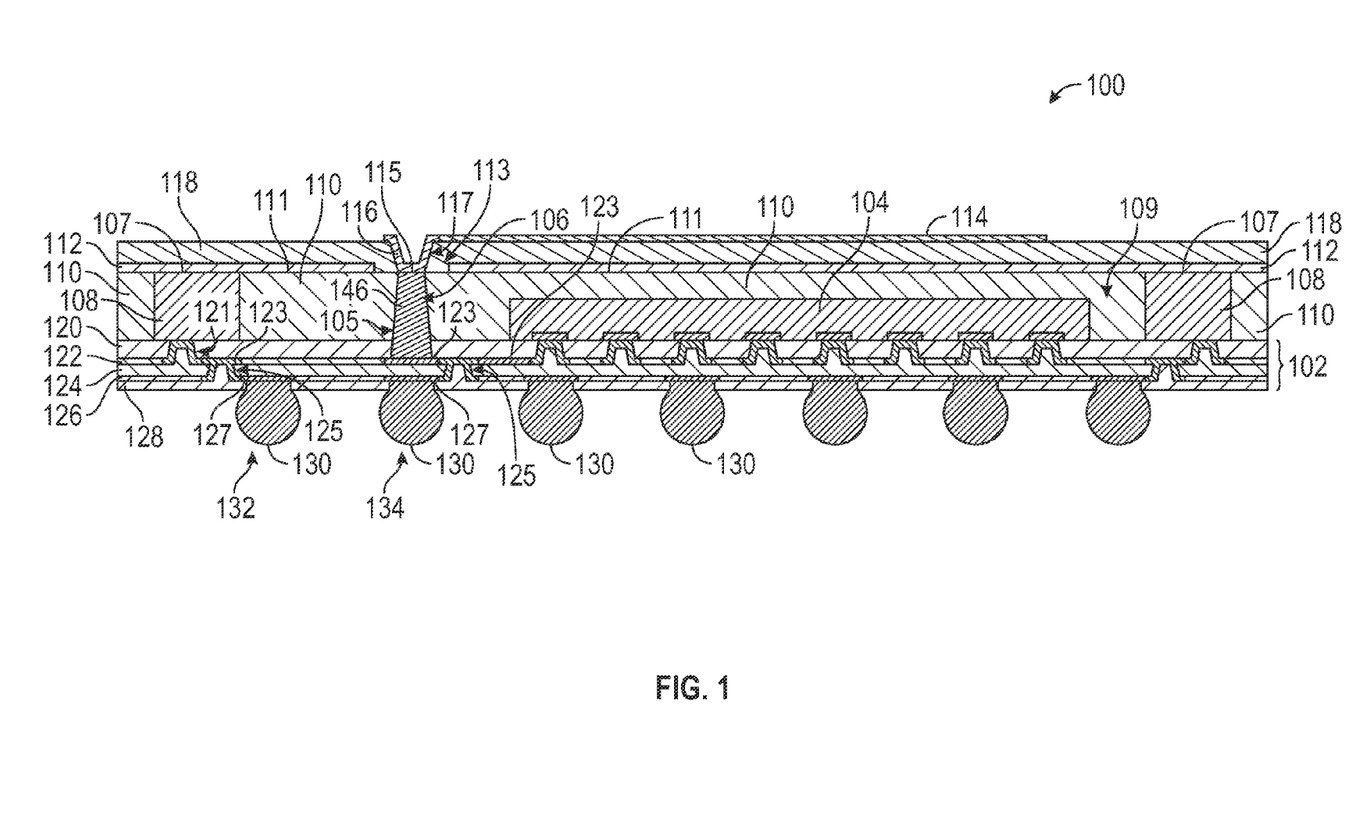
FIG. 1 depicts a cross-sectional view of an exemplary device package in accordance with one or more embodiments of the invention.
Figure 2:
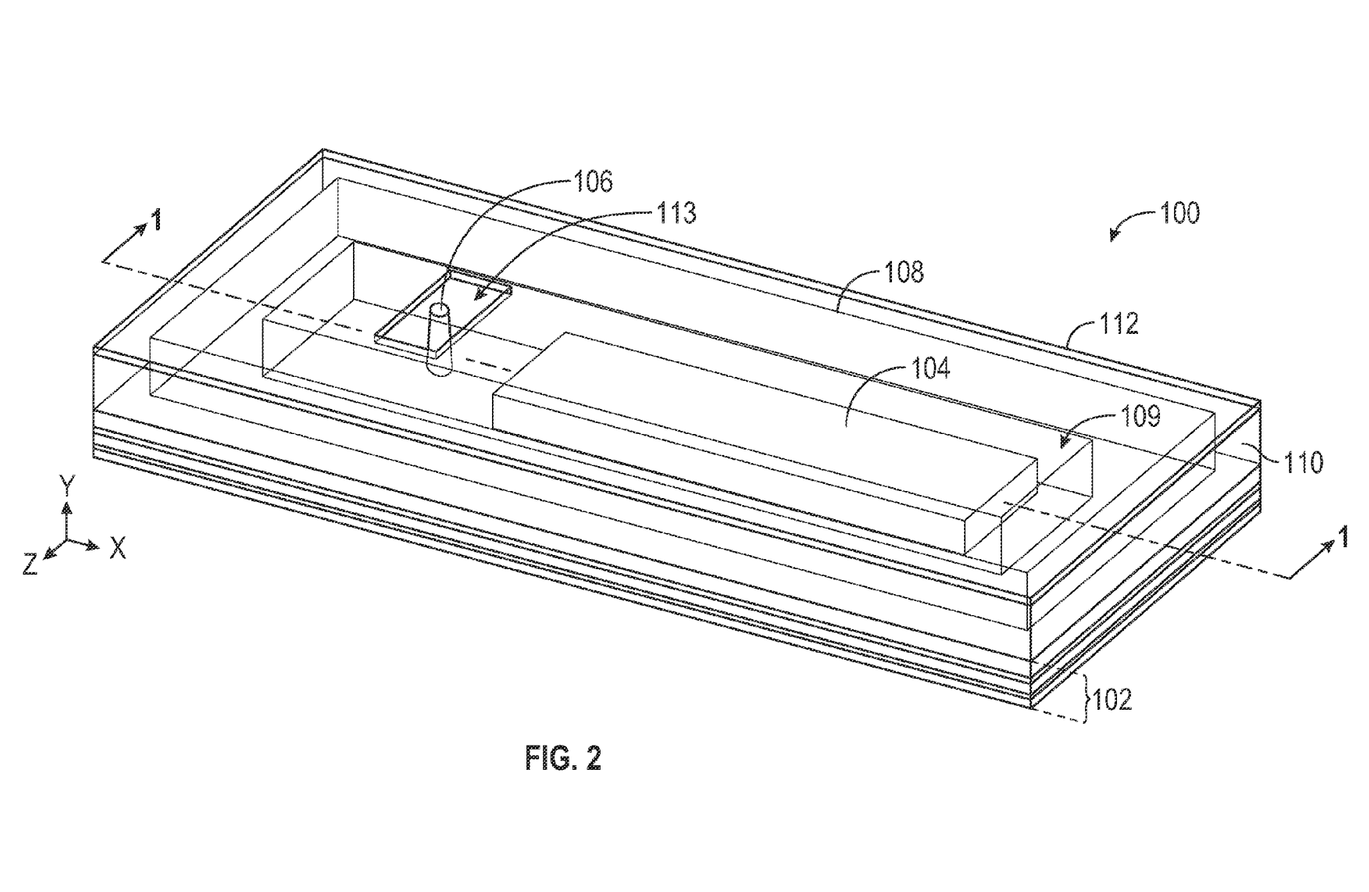

Turning now to FIGS. 1-2, in one or more exemplary embodiments, a semiconductor device package 100 includes at least one electrical component 104 and at least one conductive interconnect structure 106 that are circumscribed, surrounded, or otherwise enclosed laterally by a frame structure 108 (e.g., in the xz reference plane). In this regard, while FIGS. 1-2 depict a simplified representation of a semiconductor device package 100 that includes one electrical component 104 and one conductive interconnect structure 106, in practice, any number of electrical components 104 or interconnect structures 106 may be present in a practical embodiment of the semiconductor device package 100. Accordingly, while the subject matter may be described herein in the context of the semiconductor device package 100 that includes a single electrical component 104 and a single interconnect structure 106, the subject matter described herein is not intended to be limited to any particular number of electrical components and/or interconnect structures within an electrical component package.

In exemplary embodiments, a routing structure 102 that functions as a substrate for the device package 100 is joined, mounted, affixed or otherwise mechanically coupled to the electrical component 104, the conductive interconnect structure 106, and the frame structure 108. As described in greater detail below, in exemplary embodiments, the routing structure 102 comprises one or more layers formed on the electrical component 104, the conductive interconnect structure 106, the frame structure 108, and the molding compound 110, with the layers of the routing structure 102 being configured to provide the appropriate routing and/or electrical interconnections to/from the electrical component 104, the conductive interconnect structure 106 and the frame structure 108. An overlying molding compound 110 fills or otherwise occupies voids within the frame structure 108 between the electrical component 104, the interconnect structure 106, and the frame structure 108. In this manner, the molding compound 110 surrounds or otherwise encapsulates the electrical component 104 both laterally and vertically. The molding compound 110 also surrounds or otherwise encapsulates the interconnect structure 106 laterally. As illustrated, the dimension (e.g., the height or length) of the interconnect structure 106 in the direction orthogonal to the plane defined by the frame structure 108 (e.g., in the y reference direction) is greater than or equal to that of the molding compound 110, such that the interconnect structure 106 extends through the molding compound 110 to provide an electrical connection through the molding compound 110. Accordingly, for purposes of explanation, but without limitation, the interconnect structure 106 may alternatively be referred to herein as a through-package via or a through-via.

The semiconductor device package 100 also includes a shielding structure 112 that is joined, mounted, affixed, adhered, bonded, or otherwise mechanically coupled to at least a portion of the frame structure 108 to enclose the electrical component 104 in the dimension orthogonal to the plane defined by the frame structure 108 (e.g., in the y reference direction). The shielding structure 112 is electrically connected to the conductive frame structure 108 to allow induced currents attributable to EMI to be conducted through the shielding structure 112 and the frame structure 108 to a reference potential, as described in greater detail below. In exemplary embodiments, the shielding structure 112 has a substantially planar shape and is aligned substantially parallel to the plane of the frame structure 108 and the routing structure 102, such that the routing structure 102, the frame structure 108, and the shielding structure 112 cooperatively surround or otherwise enclose the electrical component 104 in three dimensions.

In exemplary embodiments, device package 100 includes an antenna structure 114 (and/or another suitable electrical component) overlying the shielding structure 112. In the illustrated embodiment of FIG. 1, the shielding structure 112 resides vertically between at least a portion of the electrical component 104 circumscribed by the frame structure 108 and the antenna structure 114. When the shielding structure 112 spans the portion of the enclosed region 109 defined by the frame structure 108 that includes the through-via 106, the shielding structure 112 includes a void or opening 113 aligned with the through-via 106 to allow for an electrical connection between the antenna structure 114 and the through-via 106 to be provided through the shielding structure 112. In this regard, the antenna structure 114 and dielectric layer 118 overlying the shielding structure 112 are not illustrated in FIG. 2 for purposes of illustrating the opening 113 in the shielding structure 112 that is aligned with the through-via 106.

In accordance with one or more embodiments, the electrical component 104 includes or is otherwise realized as one or more semiconductor dies (or chips) that include one or more microelectronic semiconductor devices formed or otherwise fabricated thereon, such as, one or more processors, controllers, microprocessors, microcontrollers, memory elements, logic devices, transistors, resistors, capacitors, inductors, and/or the like. For example, the electrical component 104 may be realized as a semiconductor die or another portion of a wafer of semiconductor material that includes one or more microelectronic semiconductor devices (e.g., transistors, memory cells, or the like) formed or otherwise fabricated thereon. For purposes of explanation and without limitation, the first electrical component 104 may alternatively be referred to herein as a semiconductor die (or chip). However, it will be appreciated that the subject matter described herein is not limited to any particular type of electrical component contained within the device package 100 or any particular number or combination of electrical components contained within the device package 100.

In exemplary embodiments, the frame structure 108 is realized as a substantially planar continuous structure that defines an enclosed interior region 109 that the electrical component 104 and the through-via 106 reside within. For example, as illustrated in FIGS. 1-2, the frame structure 108 is substantially aligned with the xz reference plane to laterally (or horizontally) circumscribe or otherwise enclose the electrical component 104 and the through-via 106 in the x and z reference directions within the plane defined by the frame structure 108. As best illustrated in FIG. 1, the dimension of the frame structure 108 orthogonal to the xz reference plane in the y reference direction is greater than that of the electrical component 104 in the y reference direction, so that the frame structure 108 extends from the routing structure 102 in the y reference direction by a greater distance than the electrical component 104. In other words, the height (or vertical or longitudinal dimension) of the frame structure 108 is greater than the height of the electrical component 104 relative to the routing structure 102. In accordance with one or more embodiments, the height of the frame structure 108 is at least fifty microns greater than the height of the electrical component 104. The inner perimeter of the frame structure 108 is greater than the outer perimeter of the footprint of the electrical component 104 so that at least a portion of the molding compound 110 within the interior region 109 resides laterally between the frame structure 108 and the electrical component 104, that is, the molding compound 110 surrounds the electrical component 104 and abuts the surfaces of the electrical component 104 that are not in contact with the routing structure 102. Additionally, in the embodiment of FIGS. 1-2, the inner perimeter of the frame structure 108 is large enough to encompass the through-via 106, so that the molding compound 110 surrounds the through-via 106 and abuts the vertical surfaces of the through-via 106 and portions of the molding compound 110 within the interior region 109 reside laterally between the frame structure 108 and the through-via 106. However, as described in greater detail below in the context of FIGS. 16-17, in alternative embodiments, the frame structure 108 may include an intermediate portion that resides laterally between the electrical component 104 and the through-via 106 and defines separate and distinct laterally enclosed regions having the electrical component 104 and the through-via 106 respectively disposed therein.

Still referring to FIGS. 1-2, in exemplary embodiments, the frame structure 108 is realized as a conductive material, such as a metal or alloy material (e.g., copper, copper alloy, alloy 42, nickel-iron alloy, or the like), to facilitate conducting induced currents attributable to EMI to a reference potential. In exemplary embodiments, the frame structure 108 is electrically connected to a ground reference potential and conducts induced currents attributable to EMI to the ground reference potential. The frame structure 108 is also laterally enclosed or otherwise embedded within the device package 100 by the molding compound 110. In other words, peripheral portions of the molding compound 110 that reside outside of the outer perimeter of the frame structure 108 laterally circumscribe or otherwise enclose the frame structure 108. Accordingly, for purposes of explanation but without limitation, the frame structure 108 may alternatively be referred to herein as an EGP frame by virtue of the frame structure 108 being grounded and effectively embedded within the molding compound 110 in some embodiments.

The molding compound 110 generally represents one or more dielectric encapsulant materials that encapsulate the electrical component 104, the through-via 106, and the frame structure 108. In this regard, the molding compound 110 fills any spaces between the electrical component 104, the through-via 106 and/or the frame structure 108 within the interior region 109 along with any spaces about the outer periphery of the frame structure 108 to protect the electrical component 104, the through-via 106, and the frame structure 108 from environmental elements (e.g., moisture, contamination, corrosion, and the like) and/or mechanical shock. The molding compound 110 may be formed by applying, injecting or otherwise forming any suitable encapsulant on or overlying the electrical component 104 and the frame structure 108. For example, the molding compound 110 may be realized as a thermosetting epoxy molding compound formed overlying the electrical component 104 and the frame structure 108 via printing, compression molding, or another molding technique. As described in greater detail below in the context of FIG. 6, in exemplary embodiments, the upper surface 111 of the molding compound 110 is substantially planar and substantially aligned with the upper surface 107 of the frame structure 108.

The through-via 106 is realized as one or more conductive materials 146 within the molding compound 110 that extends through the molding compound 110 to provide an electrical connection through the molding compound 110 to the routing structure 102. As described in greater detail below in the context of FIGS. 8-10, in exemplary embodiments, the through-via 106 is fabricated by forming a voided region or opening in the molding compound 110 and forming the conductive material(s) 146 within the opening 105 to a thickness or height that meets or exceeds the height of the molding compound 110. For example, a hole or bore may be drilled out of the molding compound 110 and a conductive paste may be printed, injected or otherwise applied therein to a flush fill or overfill, resulting in a conductive interconnect structure 106 within the molding compound 110. In the illustrated embodiment of FIG. 1, the upper surface 115 of the conductive interconnect structure 106 is planar and substantially laterally aligned in the xz reference plane with the upper surface 107 of the frame structure 108 and the upper surface 111 of the molding compound 110.

Still referring to FIGS. 1-2, in exemplary embodiments, the shielding structure 112 is realized as a substantially planar plate-like structure that is joined, mounted, affixed, adhered, bonded, formed on or otherwise mechanically coupled to the frame structure 108 and encloses the electrical component 104 in the y reference direction orthogonal to the plane of the frame structure 108. In this regard, when the vertical dimension (e.g., in the y reference direction) of the frame structure 108 is greater than the vertical dimension of the electrical component 104, at least a portion of the molding compound 110 overlying the electrical component 104 resides vertically between the shielding structure 112 and the electrical component 104. In exemplary embodiments, the lower surface of the shielding structure 112 is planar and abuts the planar surfaces 107, 111 of the frame structure 108 and the portion of the molding compound 110 overlying the electrical component 104. The shielding structure 112 is realized as a conductive material, such as a metal material (e.g., copper, nickel, titanium tungsten, gold, or the like) to facilitate conducting induced currents attributable to EMI to a reference potential.

In exemplary embodiments, the shielding structure 112 abuts or otherwise contacts the upper surface 107 of the frame structure 108, either directly or indirectly via a conductive adhesive material (e.g., solder or the like). Thus, the shielding structure 112 is both mechanically and electrically connected to at least a portion of the EGP frame 108, which, in turn, conducts currents induced in the shielding structure 112 by EMI vertically (e.g., in the y reference direction) to the ground reference potential.

In the embodiments of FIGS. 1-2, when the shielding structure 112 spans the portion of the enclosed region 109 having the through-via 106 disposed therein, at least a portion of the opening 113 in the shielding structure 112 is vertically aligned with the through-via 106 to prevent the shielding structure 112 from contacting the through-via 106 and allow for an electrical connection to the through-via 106 from the opposite side (or topside) of the shielding structure 112. In accordance with one or more embodiments, the through-via 106 is substantially cylindrical in shape and has a substantially circular lateral cross-section, where the opening 113 is substantially circular and concentrically aligned with the through-via 106 and has a circumference (or area) that is greater than the circumference (or area) of the end of the through-via 106 proximate the shielding structure 112. For example, if the through-via 106 has a conical frustum shape as illustrated in FIG. 1, the circumference of the opening 113 is greater than at least the smaller circumference of the through-via 106 proximate the shielding structure 112, and in some embodiments, the circumference of the opening 113 is greater than the larger circumference of the through-via 106.

In exemplary embodiments, one or more layers of dielectric material 118 are formed overlying the shielding structure 112 and the through-via 106 to provide electrical isolation between the antenna structure 114 and the shielding structure 112. A conductive via 116 is formed within an opening 117 in the dielectric layer 118 that is vertically aligned with at least a portion of the through-via 106. At least a portion of the conductive via 116 contacts or otherwise abuts at least a portion of the through-via 106, such that the vias 106, 116 are electrically connected. The antenna structure 114 overlies the layer of dielectric material 118 and is physically and/or electrically connected to the via 116, such that the via 116 provides a vertical electrical connection from the antenna structure 114 to the through-via 106 through the dielectric layer 118. In exemplary embodiments described herein, the antenna structure 114 is realized as a patterned conductive material that is formed on the upper surface of the dielectric layer 118 and contacts or is otherwise connected to the via 116. However, in alternative embodiments, the antenna structure 114 may be realized as a surface mount component or another external device or component that is soldered, bonded, joined, or otherwise provided on the dielectric layer 118 and electrically connected to the via 116. In this regard, it should be noted that while the subject matter is described herein in the context of an antenna structure 114 on the dielectric layer 118, in practice, any type and/or number of electronic devices or components may be provided on the dielectric layer 118 and coupled to an electrical component 104 contained in the device package 100 and/or an interface 130 of the device package 100 by way of the vias 106, 116.

As described in greater detail below in the context of FIG. 11, in exemplary embodiments, the routing structure 102 is realized as a plurality of redistribution metallization layers 120, 122, 124, 126, 128, such as, for example, alternating dielectric layers 120, 124, 128 and metal layers 122, 126. The first dielectric layer 120 is realized as a layer of dielectric material that is formed on or otherwise mechanically coupled to the electrical component 104, the frame structure 108, and the molding compound 110. The first dielectric layer 120 includes a plurality of conductive vias 121 within the dielectric material that are aligned with the frame structure 108 and the I/O interfaces, pads, pins, terminals, or other connection locations on the electrical component 104 to provide electrical connections to the frame structure 108 and the I/Os of the electrical component 104 vertically through the first dielectric layer 120. The first metal layer 122 includes a conductive metal material 123 formed on the first dielectric layer 120 that is patterned to provide desired lateral electrical interconnections among the I/Os of the electrical component 104 (e.g., among vias 121) and/or vertical electrical connections through the first metal layer 122 to conductive vias 125 in the second dielectric layer 124. The conductive vias 125 of the second dielectric layer 124 are aligned with respect to the conductive material 123 in the first metal layer 122 to provide desired vertical electrical interconnections between the first metal layer 122 and the conductive metal material 127 of the second metal layer 126, which is similarly patterned to provide desired lateral electrical interconnections among the I/Os of the electrical component 104 and/or vertical electrical connections through the second metal layer 126.

In the illustrated embodiment of FIGS. 1-2, a third dielectric layer 128 is formed on the second metal layer 126. The dielectric material of the third dielectric layer 128 is patterned to expose I/O pad portions of the metal material 127 of the second metal layer 126, and conductive connection structures 130 are formed on the exposed portions of the second metal layer 126 to provide appropriate I/O interfaces for the semiconductor device package 100. For example, the conductive connection structures 130 may be realized as solder balls (or solder bumps) that are formed on the exposed portions of the second metal layer 126 to facilitate soldering, bonding, or otherwise mounting the semiconductor device package 100 to a printed circuit board (PCB) or another electronics substrate that is appropriately patterned to conduct or otherwise transmit electrical signals to/from the I/Os of the semiconductor device package 100 to external electrical components and/or systems.

In exemplary embodiments, the metal layers 122, 126 and the vias 121, 125 within the dielectric layers 120, 124 are cooperatively configured to electrically connect the frame structure 108 to a conductive connection structure 132 that is configured to receive a ground reference voltage for the semiconductor device package 100. In this manner, the EGP frame 108 is electrically connected to the ground reference potential of the device package 100 via the routing structure 102, and the shielding structure 112 is electrically connected to the ground reference potential via the EGP frame 108. Accordingly, the shielding structure 112 and the EGP frame 108 cooperatively provide a grounded EMI shield that substantially encloses or otherwise surrounds the electrical component 104 of the device package 100 in the xz reference plane and the positive y reference direction. Thus, the susceptibility of the electrical component 104 to EMI emanating from the antenna structure 114 or other external sources that are laterally adjacent to the semiconductor device package 100 and/or above the semiconductor device package 100 in the positive y reference direction is reduced. Furthermore, the susceptibility of the through-via 106 to EMI emanating from external sources that are laterally adjacent to the semiconductor device package 100 is reduced.

In the illustrated embodiment, the through-via 106 extends through the first dielectric layer 120, wherein a portion of the conductive metal material 123 of the first metal layer 122 is formed on the through-via 106. In some embodiments, the conductive metal material 123 of the first metal layer 122 may be patterned to provide desired lateral electrical interconnections among one or more I/Os of the electrical component 104 and the antenna structure 114. For example, the conductive metal material 123 may route electrical signals corresponding to the electromagnetic signals sensed and/or transmitted by the antenna structure 114 to/from a via 121 connected to an I/O of a transceiver component on the die 104. Additionally or alternatively, the conductive metal material 123 of the first metal layer 122 may be patterned to provide desired lateral electrical interconnections to conductive vias 125 in the second dielectric layer 124 for routing electrical signals from/to the antenna structure 114 to/from a conductive connection structure 134 which may be coupled to external electrical components and/or systems.

FIGS. 3-15 illustrate, in cross-section, exemplary methods for fabricating a shielded semiconductor device package 300, such as the device package 100 of FIG. 1. Various steps in the manufacture of semiconductor device packages are well known and so, in the interest of brevity, many conventional steps will only be mentioned briefly herein or will be omitted entirely without providing the well-known process details. Furthermore, although the subject matter may be illustrated and described herein in the context of a single semiconductor device package 300 for purposes of explanation, it should be understood that in practice, the semiconductor device package 300 is fabricated using fan-out wafer level packaging (FO-WLP) techniques to concurrently fabricate multiple instances of the semiconductor device package 300, for example, by performing wafer reconstruction using a carrier to provide multiple instances of the electrical components to be contained within the semiconductor device packages across the carrier.

Figure 3:
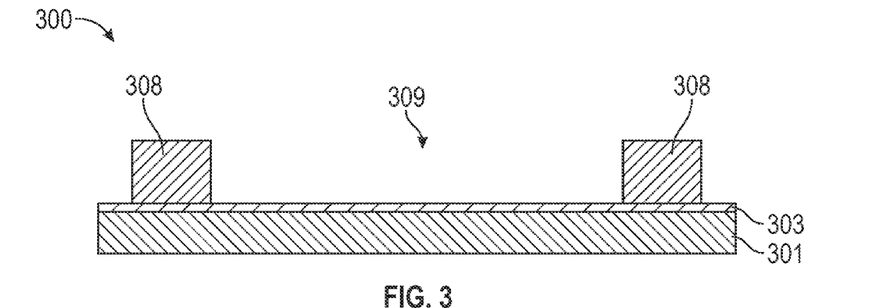
FIGS. 3-15 illustrate, in cross section, exemplary methods for fabricating a shielded semiconductor device package in accordance with one embodiment of the invention.

Referring to FIG. 3, in exemplary embodiments, the fabrication process begins by applying a detachably adhesive structure 303 to a carrier substrate 301 and providing a frame structure 308 on the adhesive structure 303, which couples, joins, or otherwise adheres the frame structure 308 to the carrier substrate 301. The carrier substrate 301 may be realized using any suitable substantially rigid material capable of providing physical support for the adhesive structure 303, and the adhesive structure 303 may be realized using any suitable adhesive material that is capable of detachably adhering to other structures or components that physically contact the adhesive structure 303. For example, in accordance with one or more embodiments, the adhesive structure 303 is realized as a double-sided tape. Applying the adhesive structure 303 to the surface of the carrier substrate 301 results in the adhesive structure 303 adhering to the surface of the carrier substrate 301. The frame structure 308 is provided on or otherwise brought into contact with the adhesive structure 303, which results in the frame structure 308 being detachably adhered to the carrier substrate 301 via the adhesive structure 303. As described above, in exemplary embodiments, the frame structure 308 is realized as a conductive material having a height relative to the carrier substrate 301 and/or adhesive structure 303 that is greater than the maximum height of the electrical component(s) 304 to be contained within the semiconductor device package 300. In other words, the height of the frame structure 308 relative to the carrier substrate 301 and/or the adhesive structure 303 that is greater than the height of all of the electrical component(s) 304 (e.g., the height of the frame structure 308 is greater than the height of tallest of the electrical component(s) 304).

Figure 4:
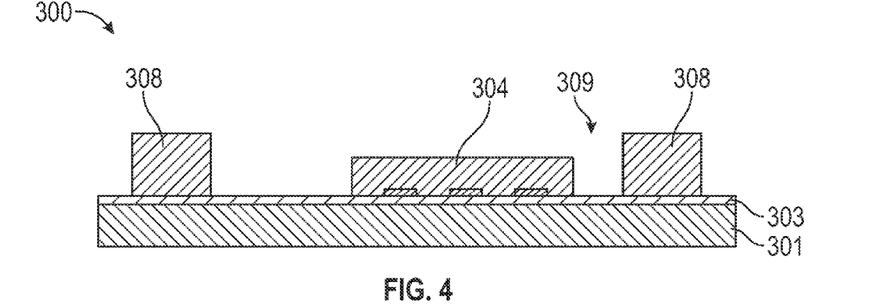

Referring to FIG. 4, in one or more embodiments, after detachably adhering the frame structure 308 to the carrier substrate 301, the fabrication process continues by detachably adhering the electrical component(s) 304 of the semiconductor device package 300 to the carrier substrate 301 via the adhesive structure 303. As described above, in one or more embodiments, the electrical component 304 is realized as a semiconductor die, wherein after the desired functional and/or logic circuitry are fabricated on a wafer of semiconductor material and diced to obtain the semiconductor die 304, the semiconductor die 304 is provided on or otherwise brought into contact with the adhesive structure 303 within the hollow interior region 309 defined by the frame structure 308, resulting in the semiconductor die 304 being detachably adhered to the carrier substrate 301 and circumscribed by the frame structure 308. In exemplary embodiments, the side of the semiconductor die 304 that includes the I/O interfaces for the circuitry fabricated on the semiconductor die 304 (e.g., the active side) is oriented downward and placed in contact with the adhesive structure 303 to facilitate subsequent formation of electrical connections to/from the I/O interfaces of the semiconductor die 304. As illustrated, the height of the electrical component(s) 304 relative to the carrier substrate 301 and/or adhesive structure 303 is less than the height of the frame structure 308.

Figure 5:
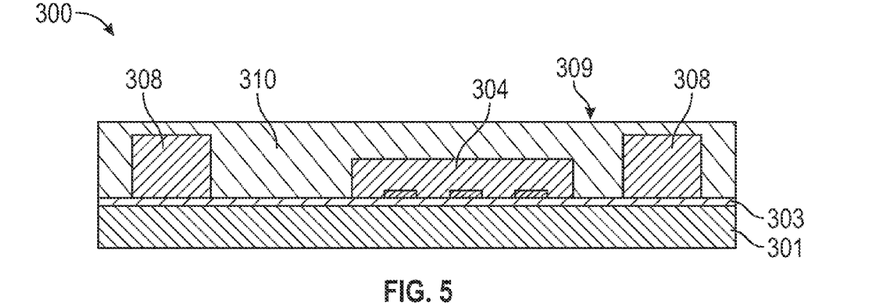
Figure 6:
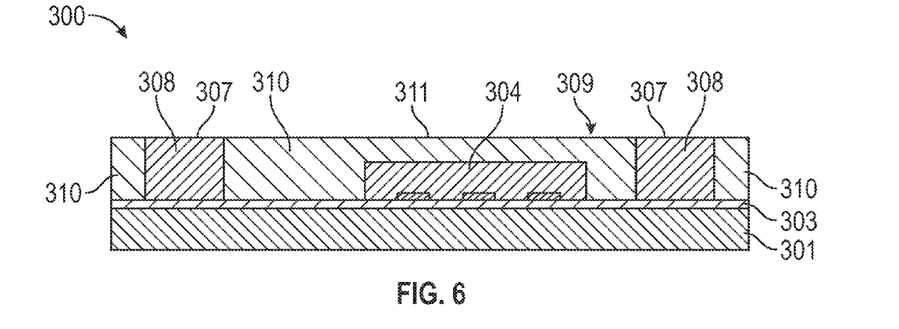

Referring now to FIGS. 5-6, in exemplary embodiments, after detachably adhering the frame structure 308 and the electrical component(s) 304 to the carrier substrate 301, the fabrication process continues by applying or otherwise forming a molding compound 310 overlying the electrical component(s) 304 and removing any portions of the molding compound 310 overlying the frame structure 308. For example, in accordance with one or more embodiments, the molding compound 310 may be formed by injecting or otherwise applying one or more encapsulant materials (e.g., epoxy, resin, or the like) overlying the carrier substrate 301 to a height (or thickness) that is greater than or equal to the height of the frame structure 308 (e.g., an overfill or flush fill), thereby ensuring that the interior region 309 defined by the frame structure 308 is completely filled by the molding compound 310. In this manner, the molding compound 310 encloses or otherwise surrounds the exposed surfaces of the electrical component(s) 304 and fills any voided portions of the interior region 309 that may reside laterally between the frame structure 308 and the electrical component(s) 304. Depending on the embodiment, one or more fabrication process steps may be performed to cure or otherwise set the molding compound 310 in a substantially rigid state that provides structural support to and/or mechanical coupling amongst the electrical component(s) 304 and the frame structure 308 after the carrier substrate 301 is detached or otherwise removed. In this regard, after the molding compound 310 is applied and set, the combination of the electrical components 304, the frame structure 308, and the molding compound 310 effectively provides a reconstructed wafer that includes the electrical components 304 thereon.

Referring to FIG. 6, in the illustrated embodiment, after forming the molding compound 310 overlying the electrical component(s) 304, the fabrication process continues by removing portions of the molding compound 310 overlying the frame structure 308 to expose the upper surface 307 of the frame structure 308. In exemplary embodiments, portions of the molding compound 310 overlying the electrical component(s) 304 and the frame structure 308 are removed substantially uniformly across the carrier substrate 301 to provide a substantially planer upper surface 311 of the molding compound 310 that is substantially aligned with the upper surface 307 of the frame structure 308. For example, in one embodiment, a grinding process may be performed to uniformly grind the molding compound 310 to until reaching the desired thickness (or height) that results in the upper surface 307 of the frame structure 308 being exposed and the upper surface 311 of the molding compound 310 being laterally aligned with the upper surface 307 of the frame structure 308. In alternative embodiments, a planarization or polishing process (e.g., chemical-mechanical planarization or the like) may be performed to remove excess portions of the molding compound 310 overlying the frame structure 308 to expose the upper surface 307 of the frame structure 308 and achieve a substantially planar upper surface 311 aligned with the upper surface 307 of the frame structure 308. In this regard, the subject matter described herein is not limited to any particular manner of removing portions of the molding compound 310 to obtain an upper surface 311 laterally aligned with the upper surface 307 of the frame structure 308. When the height of the frame structure 308 is greater than the electrical component (s) 304, portions of the molding compound 310 remain intact overlying the electrical component(s) 304 after portions of the molding compound 310 overlying the frame structure 308 are removed. In an alternative embodiment, the molding compound 310 could be removed to the height of the electrical component(s) 304 to expose the back side of the electrical component(s) 304 aligned with the upper surface 311. Furthermore, in some embodiments, the molding compound 310 may be formed to the height of the frame structure 308 (e.g., by compression molding), in which case the process steps described here in the context of FIG. 6 may be omitted from the overall fabrication process.

Figure 7:
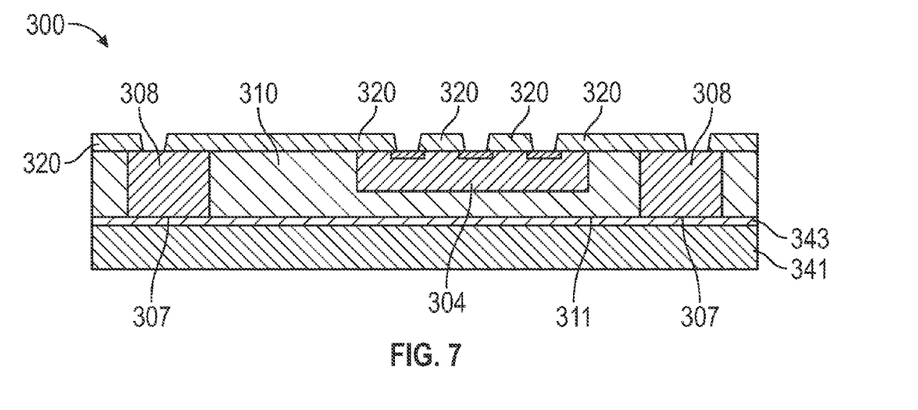

Turning now to FIG. 7, in exemplary embodiments, after forming the molding compound 310, the fabrication process continues by removing or otherwise detaching the carrier substrate 301 from the reconstructed wafer to expose the backside of the electrical component(s) 304, applying a second detachably adhesive structure 343 to a second carrier substrate 341 and detachably adhering the second carrier substrate 341 to the opposite side (or topside) of the frame structure 308 and the molding compound 310 (e.g., planar surfaces 307, 311). In this regard, the electrical component(s) 304, the frame structure 308, and the molding compound 310 are collectively detached or otherwise removed from the adhesive structure 303 in unison to obtain a reconstructed wafer that is physically distinct or otherwise separate from the carrier substrate 301, which, in turn, is attached to a second carrier substrate 341 via the second detachably adhesive structure 343 to expose the active side of the electrical component(s) 304. Thereafter, the fabrication process continues by forming at least a first layer 320 of the routing structure 302 on the active side of the electrical component(s) 304 and/or the reconstructed wafer. For example, the first dielectric layer 320 may be formed by depositing or otherwise forming a layer of dielectric material on the active side of the electrical component(s) 304 and the bottom surfaces of the frame structure 308 and the molding compound 310 and forming openings or voids in the dielectric material aligned with the frame structure 308 and the I/Os of the electrical component(s) 304 for conductive vias subsequently formed therein.

Figure 8:
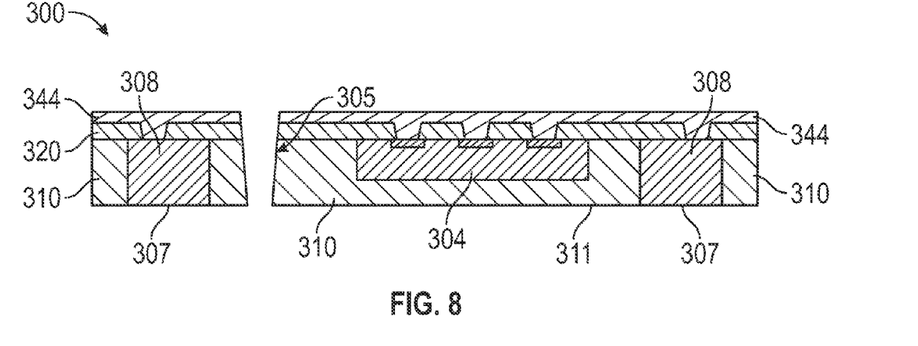
Figure 9:
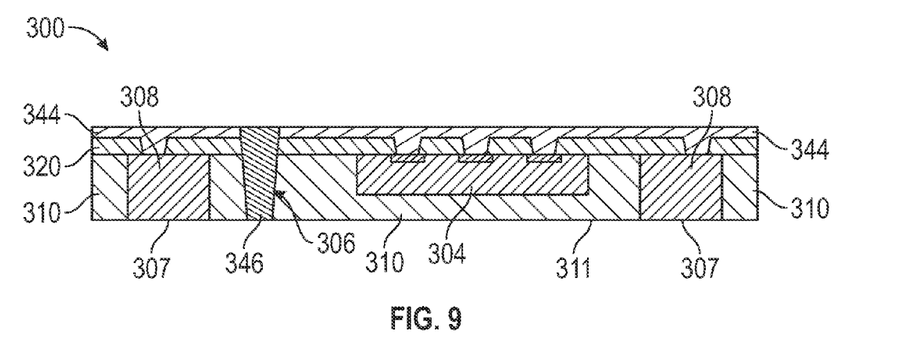
Figure 10:
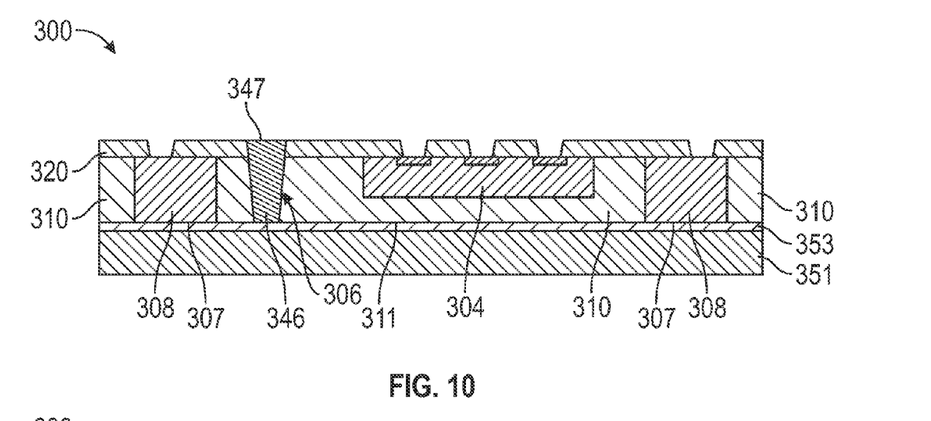

Referring now to FIGS. 8-10, in exemplary embodiments, after forming the first dielectric layer 320 of the routing structure 302, the fabrication process continues by forming the conductive interconnect structure 306 within the molding compound 310 to provide an electrical connection through the molding compound 310. As illustrated in FIG. 8, the fabrication process begins by removing or otherwise detaching the second carrier substrate 341 from the topside of the reconstructed wafer, applying or otherwise forming a protective film layer 344 on the backside (or active side) of the reconstructed wafer, and forming a hole or opening 305 that extends entirely through the protective film layer 344, the first dielectric layer 320, and the molding compound 310. For example, the opening 305 may be formed by drilling through the molding compound 310 from the backside to the opposing side. In alternative embodiments, the opening 305 may be formed by drilling through the molding compound 310 from the topside to the backside. In exemplary embodiments, the opening 305 is formed by performing a laser drilling process, however, in alternative embodiments, the opening 305 may be formed by performing a mechanical drilling process. In this regard, the protective film layer 344 protects the dielectric layer 320 from debris or other damage resulting from the drilling process (e.g., laser ablation debris, high temperatures, or the like). In exemplary embodiments, the protective film layer 344 is realized as a water soluble material, such as EMULSITONE or HOGOMAX.

Turning now to FIGS. 9-10, after forming the opening 305 in the molding compound 310, the fabrication process continues by forming one or more conductive materials 346 in the opening 305, resulting in the conductive interconnect structure 306. For example, a conductive paste may be printed, injected, rotary punched, laminated, or otherwise applied in the opening 305 to fill the opening 305 so that the resulting thickness or height of the conductive interconnect structure 306 is greater than or equal to that of the surrounding molding compound 310. After forming the conductive material(s) 346 in the opening 305, the fabrication process continues by removing the protective film layer 344, applying a third detachably adhesive structure 353 to a third carrier substrate 351, and detachably adhering the third carrier substrate 351 to the topside of the through-via 306, the frame structure 308, and the molding compound 310. In exemplary embodiments, the height or thickness of the through-via 306 after filling the opening 305 is greater than the combined height or thicknesses of the molding compound 310 and the layers 320, 344, and in such embodiments, the fabrication process continues by planarizing the through-via 306 to remove excess portions of the conductive material(s) 346 and achieve a substantially planar surface 347 aligned with the surface of the first dielectric layer 320.

Figure 11:
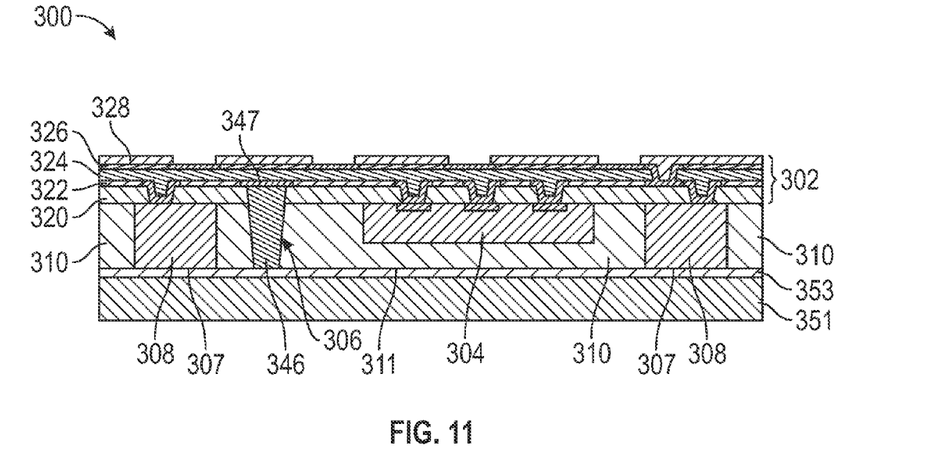

Referring to FIG. 11, after planarizing the through-via 306 to provide a surface 347 aligned with the first dielectric material 320, the fabrication process continues forming the routing structure 302 on the backside of the reconstructed wafer that provides the desired electrical interconnections to/from the electrical component(s) 304 of the semiconductor device package 300. In this regard, the conductive vias are formed within the first dielectric layer 320 and the remaining redistribution layers 322, 324, 326, 328 for the routing structure 302 are fabricated on the active side of the reconstructed wafer. For example, the vias within the first dielectric layer 120 may formed by depositing or otherwise forming a conductive material in the voids in the first dielectric layer 120 that expose the backside of the electrical component(s) 304 and the frame structure 308, resulting in conductive vias in contact with the frame structure 308 and the I/Os of the electrical component(s) 304. Thereafter, the first metal layer 322 may be formed by depositing or otherwise forming a layer of dielectric material on the first dielectric layer 320, forming voids in the dielectric material, and depositing or otherwise forming a conductive metal material in the voids. The voids are aligned with the through-via 306 and the conductive vias in the first dielectric layer 320, and the voids are patterned to provide the desired routing amongst the I/Os of the electrical component(s) 304, the through-via 306, and the frame structure 308, such that the conductive metal material of the first metal layer 322 provides the desired lateral interconnections amongst the I/Os of the electrical component(s) 304, the through-via 306, and/or the frame structure 308 within the first metal layer 320. In this regard, in some embodiments, the first metal layer 322 may be patterned to electrically connect the frame structure 308 with the I/O of a semiconductor die 304 that corresponds to the ground reference potential for the circuitry fabricated on the semiconductor die 304. Additionally, in some embodiments, the first metal layer 322 may be patterned to electrically connect the through-via 306 with the I/O of a semiconductor die 304 that corresponds to the input and/or output of a transceiver, transmitter, receiver, or another similar component on the die 304.

The additional dielectric and metal layers 324, 326 may be formed in a similar manner to provide additional vertical and/or lateral interconnections to/from the I/Os of the electrical component(s) 304, the through-via 306, and/or the frame structure 308. In this regard, in some embodiments, in lieu of or in addition to patterning the first metal layer 322 to provide an electrical connection between the frame structure 308 and the I/O of a semiconductor die 304 that corresponds to the ground reference potential, the second metal layer 326 may be patterned to electrically connect the frame structure 308 with the I/O of the semiconductor die 304 that corresponds to the ground reference potential. After metal layers 322, 326 and dielectric layers 320, 324 are formed, an outer dielectric layer 328 is formed by depositing or otherwise forming a layer of a dielectric material, etching or otherwise removing portions of the dielectric material aligned with pad portions of the underlying metal layer 326 that correspond to subsequently formed conductive connection structures 330.

Figure 12:
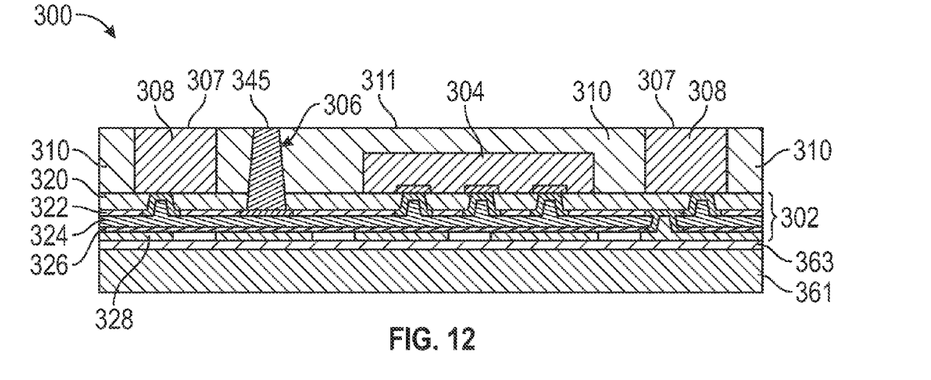
Figure 13:
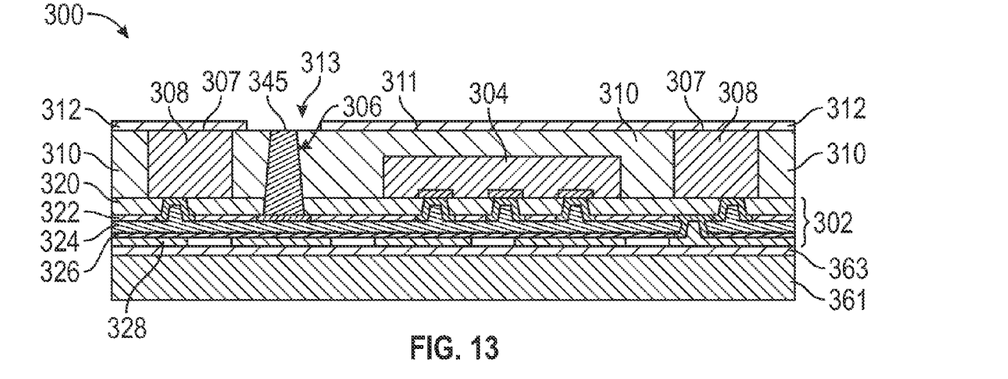

Referring now to FIG. 12-13, after forming the routing structure 302 on the backside of the reconstructed wafer, the fabrication process continues by removing or otherwise detaching the carrier substrate 351 from the topside of the reconstructed wafer and detachably adhering the backside of the reconstructed wafer to another carrier substrate 361 via another detachably adhesive material 363. Thereafter, the fabrication process continues by planarizing the through-via 306 to provide a planar upper surface 315 substantially aligned with the surfaces 307, 311 of the frame structure 308 and molding compound 310 and forming the shielding structure 312 on the topside of the reconstructed wafer. For example, in one or more embodiments, a contiguous layer of a conductive metal material, such as copper nickel, titanium tungsten, gold, or the like, may be formed on the upper surfaces 307, 311 of the frame structure 308 and the molding compound 310 by plating, sputtering, physical vapor deposition (PVD), or another suitable deposition process. In this manner, the shielding structure 312 abuts or otherwise contacts the upper surface 307 of the frame structure 308, thereby establishing an electrical connection. In one or more embodiments, when PVD is performed to fabricate the shielding structure 312, the thickness of the shielding structure 312 may range from about 0.2 microns to about 1 micron. In another embodiment, when sputtering or another process is performed to fabricate the shielding structure 312, the thickness of the shielding structure 312 may range from about 1 micron to about 10 microns. To achieve relatively higher thicknesses, in some embodiments, a sputtering or deposition process may be performed to form a relatively thinner layer of conductive metal material followed by an electroplating process to increase the thickness of the conductive metal material to the desired thickness for the shielding structure 312. By virtue of the physical contact between the frame structure 308 and the shielding structure 312, the shielding structure 312 and the frame structure 308 are electrically connected to one another and also to the ground reference potential to facilitate conducting currents induced by EMI in the shielding structure 312 to ground.

As described above in the context of FIG. 1, the shielding structure 312 includes an opening 313 that is aligned with the through-via 306 so that the topside surface 315 of the through-via 306 is exposed after forming the shielding structure 312 overlying the frame structure 308 and the molding compound 310. For example, a photoresist material or another material capable of preventing formation of the conductive material of the shielding structure 312 may be formed overlying the through-via 306, such that no conductive material of the shielding structure 312 is formed on the through-via 306. In one embodiment, a photoresist material is provided on the through-via 306 that covers at least the entire topside surface 315 of the through-via 306 prior to exposing the topside surface of the reconstructed wafer to an electroplating bath that results in formation of the shielding structure 312 on the topside of the reconstructed wafer everywhere the photoresist material is not applied. In alternative embodiments, a layer of conductive material for the shielding structure 312 may be conformably deposited across the topside surface of the reconstructed wafer, and thereafter, a masking material is formed overlying the shielding structure 312 and patterned to expose the conductive material overlying the through-via 306 before etching the conductive material to remove any conductive material on the through-via 306 and form the opening 313 in the shielding structure 312.

In alternative embodiments, the shielding structure 312 may be realized as a conductive metal material that is formed into plate or another suitable planar structure that is bonded, joined, mounted, soldered, affixed or otherwise adhered to the upper surface 307 of the frame structure 308 and spans the interior region 309 defined by the frame structure 308. In this regard, in lieu of forming a conductive metal material on the topside of the reconstructed wafer, the semiconductor device package 300 of FIG. 13 may be achieved by aligning the shielding structure 312 with the frame structure 308 such that the opening 313 is aligned with the through-via 306 and fixedly engaging the shielding structure 312 in electrical contact with the frame structure 308. For example, the shielding structure 312 may be realized as a copper plate that is soldered to the upper surface 307 of the frame structure 308 by performing a reflow soldering process. Alternatively, the shielding structure 312 may be bonded to the upper surface 307 of the frame structure 308, for example, by using a conductive epoxy. In this regard, depending on the embodiment, the shielding structure 312 may contact the frame structure 308 directly or indirectly via the conductive adhesive used to adhere the shielding structure 312 to the frame structure 308. It should be noted that depending on the process used to fixedly engage the shielding structure 312 in electrical contact with the frame structure 308, the interior portion of the shielding structure 312 that overlies the interior region 309 may or may not be joined or otherwise adhered to the underlying molding compound 310 within the interior region 309.

Figure 14:
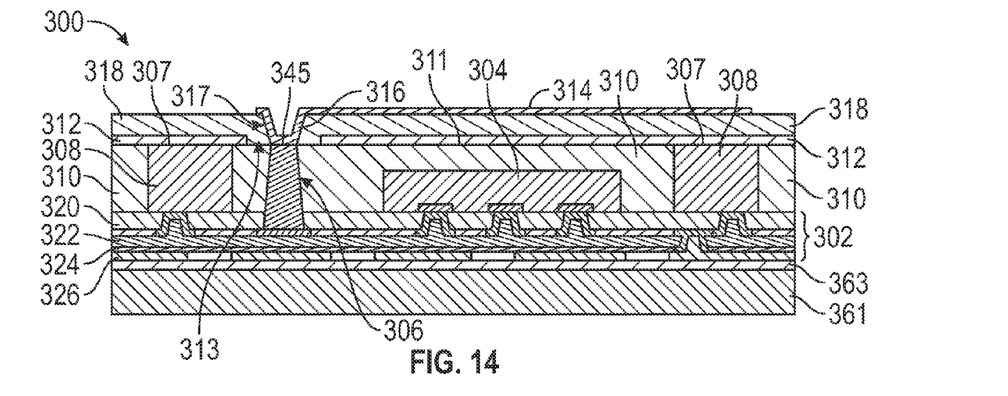

Turning now to FIG. 14, after forming the shielding structure 312, the fabrication process continues by forming the antenna structure 314 overlying the shielding structure 312 and providing an electrical connection between the antenna structure 314 and the through-via 306. In exemplary embodiments, prior to forming the antenna structure 314, a layer of dielectric material 318 is deposited or otherwise formed overlying the shielding structure 312 and the through-via 306, and a conductive via 316 overlying the through-via 306 is formed within the dielectric material 318. For example, the dielectric material 318 may be patterned and etched to form an opening 317 in the dielectric material 318 that is vertically aligned with the through-via 306. Thereafter, a conductive material may be deposited or otherwise formed in the opening 317 and on the topside surface 315 of the through-via 306 to a thickness that is greater than or equal to the thickness of the dielectric material 318, resulting in the via 316 that provides an electrical connection to the through-via 306 through the dielectric material 318. In accordance with one or more embodiments, the thickness of the dielectric material 318 overlying the shielding structure 312 is in the range of about 100 microns to about 200 microns to provide a separation distance between the antenna structure 314 and the shielding structure 312 (e.g. the ground plane) that results in a desired bandwidth for the antenna structure 314; however, in alternative embodiments, the dielectric material 318 may be thicker and/or thinner and/or the dielectric material 318 between the shielding structure 312 and the antenna structure 314 may be realized using multiple sublayers of one or more dielectric materials.

The fabrication process continues by forming or otherwise depositing a conductive material on the upper surface of the dielectric material 318, wherein the conductive material is patterned or otherwise arranged to provide the antenna structure 314. For example, a photoresist material may be applied across the topside of the reconstructed wafer and patterned to define the antenna structure 314 to be formed by plating the exposed surfaces of the dielectric material 318. In alternative embodiments, a layer of conductive material may be sputtered, deposited, or otherwise formed on the topside of the dielectric material 318 and then etched to define the antenna structure 314. In exemplary embodiments, the antenna structure 314 is patterned such that the conductive material of the antenna structure 314 abuts, contacts, or is otherwise electrically connected to the via 316 through the dielectric material 318, thereby electrically connecting the antenna structure 314 to the through-via 306. In this manner, electrical connections to/from the antenna structure 314 may be made within the routing structure 302, thereby allowing electrical signals to be transmitted to/from the antenna structure 314 from/to the die 304 while at the same time providing electromagnetic shielding between the antenna structure 314 and the die 304 by virtue of the portion of the shielding structure 312 that resides between the antenna structure 314 and the die 304.

Figure 15:
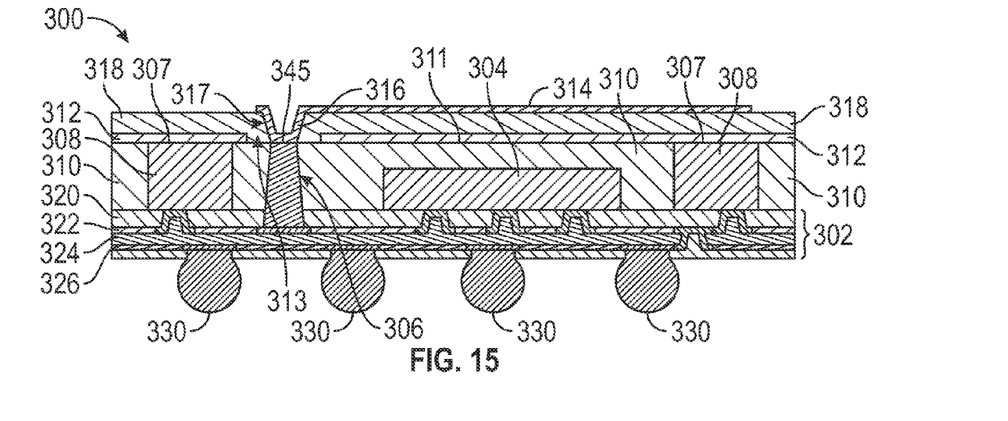

Referring to FIG. 15, in exemplary embodiments, after fabricating the antenna structure 314, the fabrication process continues by removing or otherwise detaching the carrier substrate 361 from the backside of the reconstructed wafer and forming conductive connection structures 330 on or otherwise in contact with the exposed pad portions of the lowest metal layer 326 to provide the desired I/O interfaces for the resulting semiconductor device package 300. As described above, the underlying metal layers 322, 326 are patterned or otherwise configured so that the frame structure 308 is electrically connected to the particular connection structure 330 that corresponds to the ground reference potential for the semiconductor device package 300. Thereafter, fabrication of the semiconductor device package 300 is completed by dicing, sawing, or otherwise singulating the reconstructed wafer about the frame structure 308. In this regard, the scribe lines used to singulate the reconstructed wafer are offset from the frame structure 308 by a nonzero distance so that the resultant device package 300 includes peripheral portions of molding compound 310 that laterally circumscribe or otherwise enclose the frame structure 308. The peripheral portions of the molding compound 310 prevent inadvertent lateral electrical connections to the frame structure 308 that could otherwise influence the electrical potential of the frame structure 308. After singulation, the connection structures 330 may be utilized to solder, mount, bond, join, affix, or otherwise adhere the semiconductor device package 300 to a PCB or other electronics substrate configured to route or otherwise transmit the appropriate I/O and reference voltage signals for the electrical component(s) 304 to/from the semiconductor device package 300. As described above, the ground reference voltage potential provided to the electrical component (s) 304 via the connection structure(s) 330 is also provided to the frame structure 308 and the shielding structure 312 via the metal layers 322, 326, so that the frame structure 308 and the shielding structure 312 provide a grounded EMI shield for the electrical component(s) 304 of the semiconductor device package 300 above the routing structure 302.

Figure 16:
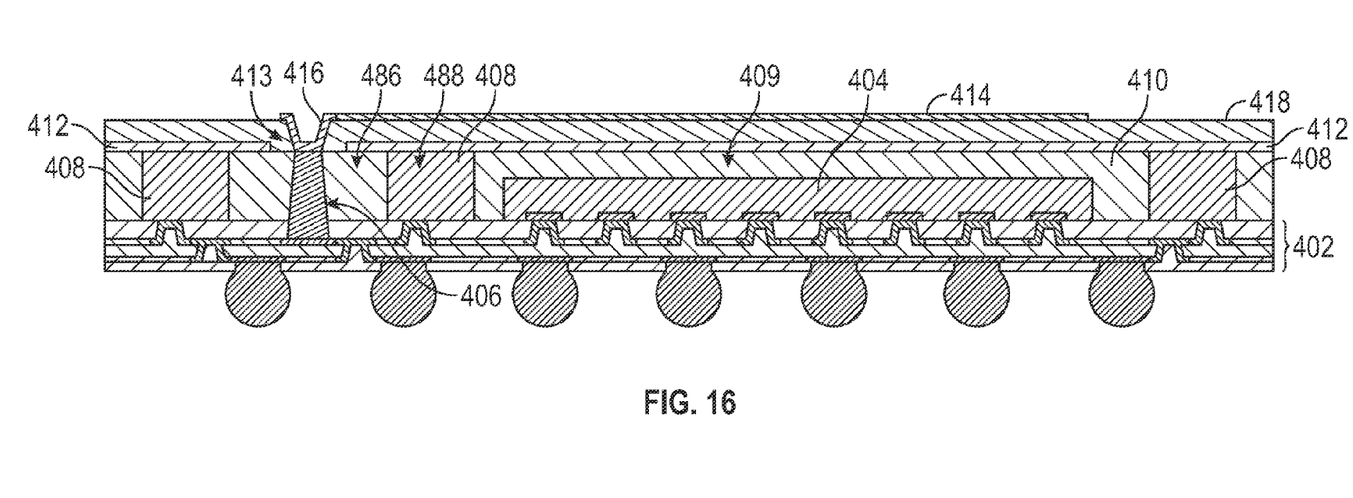
FIG. 16 depicts a cross-sectional view of an exemplary device package in accordance with one or more embodiments of the invention.
Figure 17:
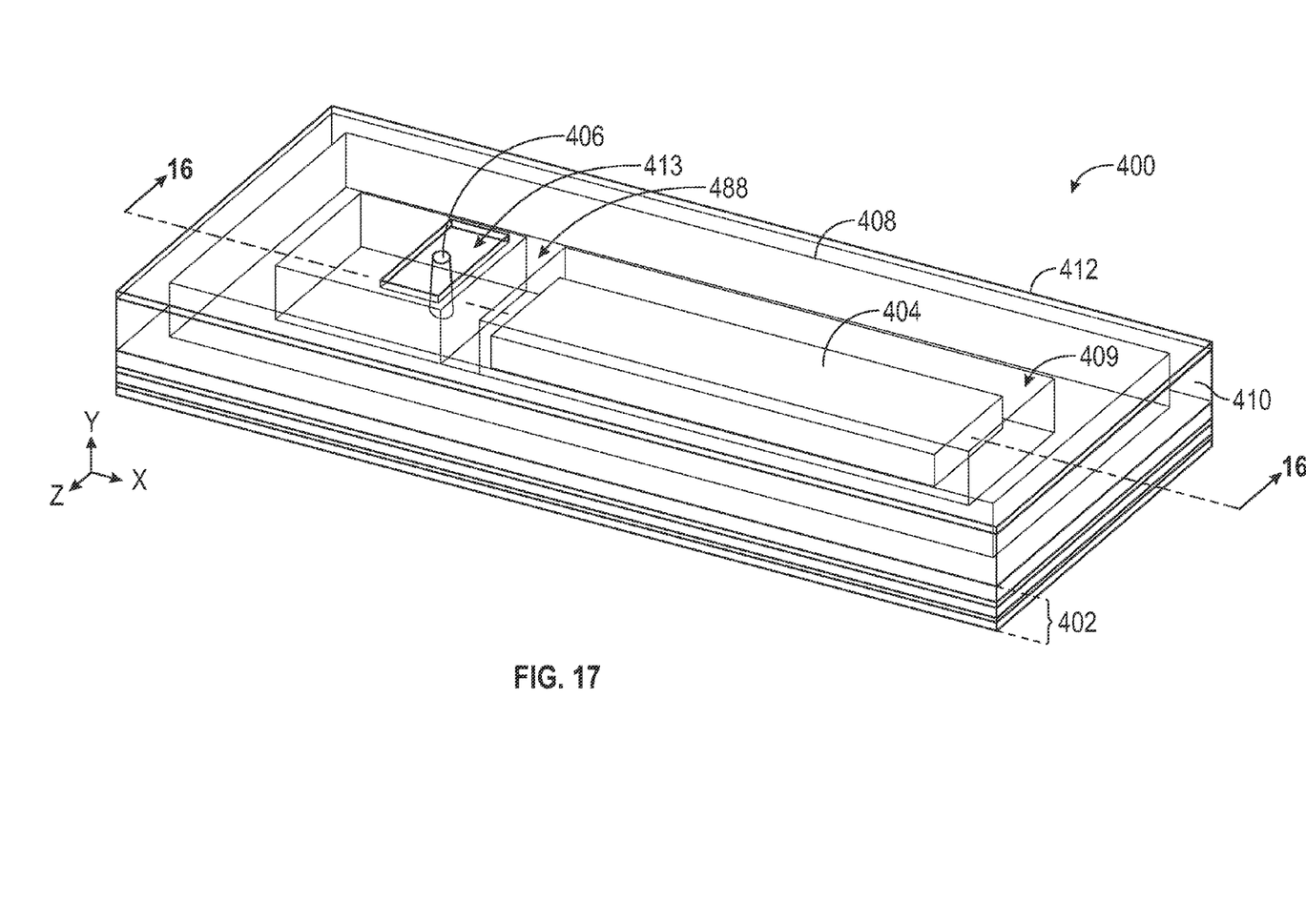

FIGS. 16-17 depict another embodiment of a shielded semiconductor device package 400 that includes an antenna structure 414 overlying a conductive shielding structure 412. In the embodiment of FIGS. 16-17, the frame structure 408 includes an intermediate portion 488 that separates a laterally enclosed region 409 having the electrical component(s) 404 contained therein from another laterally enclosed region 486 having the conductive interconnect structure 406 formed therein. In this regard, the antenna structure 414 and dielectric layer 418 overlying the shielding structure 412 are not illustrated in FIG. 17 for purposes of illustrating the separate enclosed regions 409, 486 defined by the intermediate portion 488 of the frame structure 408 in addition to the opening 413 in the shielding structure 412 that is aligned with the through-via 406.

In a similar manner as described above, the shielding structure 412 covers, spans, or otherwise overlies at least the laterally enclosed region 409 and is electrically connected to the frame structure 408, such that the frame structure 408 and the shielding structure 412 provide a grounded EMI shield that encloses or otherwise surrounds the electrical component (s) 404 of the device package 400 above the routing structure 402. In this regard, by virtue of the intermediate portion 488 of the frame structure 408 defining a laterally enclosed region 409 that circumscribes the electrical component(s) 404, not only does the shielding structure 412 shield the underlying electrical component(s) 404 from EMI resulting from transmitting electromagnetic signals via the antenna 414 or other external electromagnetic signals that may be received by the antenna 414, but the intermediate portion 488 of the frame structure 408 also shields and electromagnetically isolates the electrical component(s) 404 from electromagnetic signals that may be emanated from the through-via 406. In this manner, the susceptibility of the electrical component(s) 404 to any EMI that may emanate from the through-via 406 is reduced relative to the semiconductor device package 100 described above in the context of FIGS. 1-2. In a similar manner as described above, when the shielding structure 412 also overlies the laterally enclosed via region 486, an opening 413 aligned with the through-via 406 is provided within the shielding structure 412 to accommodate a conductive via 416 through an intermediate dielectric layer 418 between the shielding structure 412 and the antenna structure 414 to provide an electrical connection between the through-via 406 and the antenna structure 414 through the shielding structure 412.

For the sake of brevity, conventional techniques related to semiconductor and/or integrated circuit fabrication, EMI shielding, antennas, and other functional aspects of the subject matter may not be described in detail herein. In addition, certain terminology may be used herein for the purpose of reference only, and thus are not intended to be limiting. For example, the terms "first," "second," and other such numerical terms referring to structures do not imply a sequence or order unless clearly indicated by the context, and terms such as "upper," "lower," "top," "bottom," and the like refer to directions in the drawings to which reference is made. The foregoing description also refers to elements or nodes or features being "connected" or "coupled" together. As used herein, unless expressly stated otherwise, "connected" means that one element is directly joined to (or directly communicates with) another element, and not necessarily mechanically. Likewise, unless expressly stated otherwise, "coupled" means that one element is directly or indirectly joined to (or directly or indirectly communicates with) another element, and not necessarily mechanically. Thus, although a schematic shown in the figures may depict direct electrical connections between circuit elements and/or terminals, alternative embodiments may employ intervening circuit elements and/or components while functioning in a substantially similar manner.

In conclusion, systems, devices, and methods configured in accordance with exemplary embodiments of the invention relate to:

An apparatus for a device package is provided. The device package comprises one or more electrical components, a molding compound overlying the one or more electrical components, a conductive interconnect structure within the molding compound, a conductive frame structure laterally surrounding the one or more electrical components and the interconnect structure, and a shielding structure overlying the one or more electrical components. The shielding structure is electrically connected to the frame structure and at least a portion of the molding compound resides between the shielding structure and the one or more electrical components. In one embodiment, the shielding structure contacts a first surface of the frame structure and the first surface of the frame structure is aligned with a second surface of the portion of the molding compound. In a further embodiment, a third surface of the interconnect structure is aligned with the first surface and the second surface. In another embodiment, the shielding structure comprises a planar structure having an opening aligned with the interconnect structure. In other embodiments, an intermediate portion of the frame structure resides between the interconnect structure and the one or more electrical components, the intermediate portion of the frame structure defining a first enclosed region and a second enclosed region, wherein the interconnect structure resides within the first enclosed region and the one or more electrical components reside within the second enclosed region. In one embodiment, the shielding structure contacts the frame structure. In another embodiment, the interconnect structure is electrically isolated from the shielding structure. In another embodiment, the shielding structure includes an opening concentrically aligned with the interconnect structure, and a circumference of the opening is greater than a circumference of the interconnect structure. In one or more embodiments, the device package further comprises an antenna structure overlying the shielding structure, wherein the antenna structure is electrically connected to the interconnect structure. In further embodiments, the device package comprises a dielectric material overlying the shielding structure, wherein the antenna structure overlies the dielectric material, and a via within the dielectric material, the via overlying the interconnect structure, wherein the antenna structure is electrically coupled to the via. In yet another embodiment, the device package further comprises a routing structure, wherein the one or more electrical components, the frame structure, the interconnect structure, and the molding compound overlie the routing structure, and a connection structure to receive a reference voltage, wherein the routing structure provides a first electrical connection between the connection structure and the frame structure. In one embodiment, the device package further comprises an antenna structure overlying the shielding structure, wherein the antenna structure is electrically connected to the interconnect structure and the interconnect structure provides a second electrical connection between the routing structure and the antenna structure. In accordance with another embodiment, a second portion of the molding compound resides laterally between the frame structure and the one or more electrical components and the frame structure resides laterally between the second portion of the molding compound and a third portion of the molding compound.

A method of fabricating a device package is also provided. The method involves providing a frame structure circumscribing one or more electrical components, the frame structure having a first surface, forming a molding compound overlying the one or more electrical components, the molding compound having a second surface aligned with the first surface, wherein a first portion of the molding compound resides between the frame structure and the one or more electrical components, forming an interconnect structure within the molding compound, the frame structure circumscribing the interconnect structure and providing a shielding structure overlying the one or more electrical components, wherein the shielding structure is electrically connected to the frame structure and a second portion of the molding compound resides between the one or more electrical components and the shielding structure. In one or more embodiments, the method further comprises forming an antenna structure overlying the shielding structure, wherein the antenna structure is electrically connected to the interconnect structure. In one embodiment, the method further comprises forming a dielectric layer overlying the shielding structure and the interconnect structure and forming a conductive via within the dielectric layer, the conductive via contacting at least a portion of the interconnect structure, wherein forming the antenna structure comprises forming a conductive material on the dielectric layer, the conductive material being patterned to provide an electrical connection to the conductive via. In another embodiment, the method further comprises forming a routing structure on the frame structure and the one or more electrical components and forming a connection interface for receiving a ground reference voltage on the routing structure, wherein the routing structure is configured to provide a first electrical connection between the interconnect structure and an interface of an electrical component of the one or more electrical components and a second electrical connection between the frame structure and the connection interface.

In another embodiment, a device package comprises one or more electrical components, a molding compound overlying the one or more electrical components, the molding compound having a planar upper surface, a conductive interconnect structure within the molding compound, the interconnect structure having a first surface aligned with the planar upper surface of the molding compound, a conductive frame structure circumscribing the one or more electrical components and the interconnect structure, the frame structure having a second surface aligned with the planar upper surface of the molding compound, at least a first portion of the molding compound residing laterally between the frame structure and the one or more electrical components and a second portion of the molding compound circumscribes the frame structure, a shielding structure overlying the one or more electrical components, the shielding structure contacting the second surface of the frame structure and at least a third portion of the molding compound residing between the shielding structure and the one or more electrical components, and an antenna structure overlying the shielding structure, wherein the antenna structure is electrically coupled to the interconnect structure.

While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application. Accordingly, details of the exemplary embodiments or other limitations described above should not be read into the claims absent a clear intention to the contrary.

What is claimed is:

1. A device package comprising:
   one or more electrical components;
   a molding compound overlying the one or more electrical components;
   a conductive interconnect structure within the molding compound; a conductive frame structure laterally surrounding the one or more electrical components and the interconnect structure; and
   a shielding structure overlying the one or more electrical components, wherein:
   the shielding structure is electrically connected to the frame structure;
   at least a portion of the molding compound resides between the shielding structure and the one or more electrical components;
   the shielding structure contacts a first surface of the frame structure; and
   the first surface of the frame structure is aligned with a second surface of the portion of the molding compound.

2. The device package of claim 1, wherein a third surface of the interconnect structure is aligned with the first surface and the second surface.

3. The device package of claim 1, wherein the shielding structure comprises a planar structure having an opening aligned with the interconnect structure.

4. The device package of claim 1, wherein an intermediate portion of the frame structure resides between the interconnect structure and the one or more electrical components.

5. The device package of claim 4, the intermediate portion of the frame structure defining a first enclosed region and a second enclosed region, wherein:
   the interconnect structure resides within the first enclosed region; and
   the one or more electrical components reside within the second enclosed region.

6. The device package of claim 1, wherein the shielding structure contacts the frame structure.

7. The device package of claim 1, wherein the interconnect structure is electrically isolated from the shielding structure.

8. The device package of claim 1, wherein:
   the shielding structure includes an opening concentrically aligned with the interconnect structure; and
   a circumference of the opening is greater than a circumference of the interconnect structure.

9. The device package of claim 1, further comprising an antenna structure overlying the shielding structure, wherein the antenna structure is electrically connected to the interconnect structure.

10. The device package of claim 9, further comprising a dielectric material overlying the shielding structure, wherein the antenna structure overlies the dielectric material.

11. The device package of claim 10, further comprising a via within the dielectric material, the via overlying the interconnect structure, wherein the antenna structure is electrically coupled to the via.

12. The device package of claim 1, further comprising:
   a routing structure, wherein the one or more electrical components, the frame structure, the interconnect structure, and the molding compound overlie the routing structure; and
   a connection structure to receive a reference voltage, wherein the routing structure provides a first electrical connection between the connection structure and the frame structure.

13. The device package of claim 12, further comprising an antenna structure overlying the shielding structure, wherein:
   the antenna structure is electrically connected to the interconnect structure; and
   the interconnect structure provides a second electrical connection between the routing structure and the antenna structure.

14. The device package of claim 1, wherein:
   a second portion of the molding compound resides laterally between the frame structure and the one or more electrical components; and
   the frame structure resides laterally between the second portion of the molding compound and a third portion of the molding compound.

15. A method of fabricating a device package, the method comprising:
   providing a frame structure circumscribing one or more electrical components, the frame structure having a first surface;
   forming a molding compound overlying the one or more electrical components, the molding compound having a second surface aligned with the first surface, wherein a first portion of the molding compound resides between the frame structure and the one or more electrical components;
   forming an interconnect structure within the molding compound, the frame structure circumscribing the interconnect structure; and
   providing a shielding structure overlying the one or more electrical components, wherein the shielding structure is electrically connected to the frame structure and a second portion of the molding compound resides between the one or more electrical components and the shielding structure.

16. The method of claim 15, further comprising forming an antenna structure overlying the shielding structure, wherein the antenna structure is electrically connected to the interconnect structure.

17. The method of claim 16, further comprising:
   forming a dielectric layer overlying the shielding structure and the interconnect structure; and
   forming a conductive via within the dielectric layer, the conductive via contacting at least a portion of the interconnect structure, wherein forming the antenna structure comprises forming a conductive material on the dielectric layer, the conductive material being patterned to provide an electrical connection to the conductive via.

18. The method of claim 16, further comprising:

forming a routing structure on the frame structure and the one or more electrical components; and forming a connection interface for receiving a ground reference voltage on the routing structure, wherein the routing structure is configured to provide a first electrical connection between the interconnect structure and an interface of an electrical component of the one or more electrical components and a second electrical connection between the frame structure and the connection interface.

19. A device package comprising:

one or more electrical components;

a molding compound overlying the one or more electrical components, the molding compound having a planar upper surface;

a conductive interconnect structure within the molding compound, the interconnect structure having a first surface aligned with the planar upper surface of the molding compound;

a conductive frame structure circumscribing the one or more electrical components and the interconnect structure, the frame structure having a second surface aligned with the planar upper surface of the molding compound, at least a first portion of the molding compound residing laterally between the frame structure and the one or more electrical components and a second portion of the molding compound circumscribes the frame structure;

a shielding structure overlying the one or more electrical components, the shielding structure contacting the second surface of the frame structure and at least a third portion of the molding compound residing between the shielding structure and the one or more electrical components; and an antenna structure overlying the shielding structure, wherein the antenna structure is electrically coupled to the interconnect structure.

* * * * *